(12) United States Patent
Arai et al.

(10) Patent No.: US 8,595,917 B2
(45) Date of Patent: Dec. 3, 2013

(54) METHOD FOR IMPROVING A FLEXURE'S ELECTRICAL CHARACTERISTICS

(75) Inventors: Hajime Arai, Aikoh-gun (JP); Eijiro Furuta, Aikoh-gun (JP); Koichi Kusakawa, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 13/480,101

(22) Filed: May 24, 2012

(65) Prior Publication Data

US 2012/0231156 A1   Sep. 13, 2012

Related U.S. Application Data

(62) Division of application No. 12/154,251, filed on May 21, 2008, now Pat. No. 8,218,267.

(30) Foreign Application Priority Data

May 21, 2007   (JP) ................................ 2007-134001

(51) Int. Cl.
*G11B 5/127* (2006.01)
*H04R 31/00* (2006.01)

(52) U.S. Cl.
USPC .................. 29/603.04; 29/603.03; 29/603.07; 205/119; 205/122; 360/244.2; 360/244.8; 360/294.4; 360/294.5; 360/294.7

(58) Field of Classification Search
USPC ................ 29/603.3, 603.04, 603.06, 603.07; 205/119, 122; 216/39, 65; 360/244.8, 360/244.2, 244, 240, 294.4–294.7; 257/778, 783
See application file for complete search history.

(56) References Cited

U.S. PATENT DOCUMENTS

| | | | |
|---|---|---|---|
| 6,487,048 B1 | 11/2002 | Dunn | |
| 7,643,252 B2 * | 1/2010 | Arai et al. | ................. 360/245.9 |
| 7,782,571 B2 | 8/2010 | Ishii et al. | |
| 2005/0248885 A1 | 11/2005 | Funada et al. | |
| 2006/0187587 A1 | 8/2006 | Arai et al. | |
| 2006/0190673 A1 | 8/2006 | Arai et al. | |

FOREIGN PATENT DOCUMENTS

JP   2003-203436   7/2003

* cited by examiner

*Primary Examiner* — Paul D Kim
(74) *Attorney, Agent, or Firm* — Jordan and Hamburg LLP

(57) ABSTRACT

A flexure 11 has a substrate 13 made of a thin conductive metal plate, a base insulating layer 31 made of flexible resin formed on the substrate, wiring patterns 15 formed on the base insulating layer and connected to a slider mount 17, and a cover insulating layer 33 formed over the wiring patterns. The flexure 11 is substantially coated with a conductive polymer layer 39 having a thickness in the range of 18 to 130 nm. The flexure 11 prevents electrostatic accumulation and ion migration that are trade-offs.

4 Claims, 12 Drawing Sheets

Coating range and migration endurance (time)

Fig.15

|  | Film thickness [nm] | Resistance [Ω] |
|---|---|---|
| Comparative example 1 | 10 | 1.20E+10 |
| Example 1 | 18.7 | 5.00E+09 |
| Example 2 | 27.3 | 2.00E+09 |
| Example 3 | 37 | 8.00E+08 |
| Example 4 | 50 | 3.00E+08 |
| Example 5 | 100 | 3.00E+07 |
| Comparative example 2 | 150 | 5.00E+06 |
| Comparative example 3 | 200 | 1.00E+06 |

METHOD FOR IMPROVING A FLEXURE'S ELECTRICAL CHARACTERISTICS

REFERENCE TO RELATED APPLICATION

This is a divisional application of Ser. No. 12/154,251, filed May 21, 2008, now U.S. Pat. No. 8,218,267. The subject matter of the aforementioned prior application is hereby incorporated herein by reference.

BACKGROUND OF THE INVENTION

1. Field of the Invention

The present invention relates to a flexure provided with wiring and used for a head suspension of a hard disk drive. In particular, the present invention relates to a flexure having wiring, capable of solving the problems of electrostatic discharge and ion migration that are trade-offs. The present invention also relates to a method of manufacturing such a flexure and a head suspension employing such a flexure.

2. Description of Related Art

A hard disk drive (HDD) has a head suspension to support a head for writing and reading data to and from a hard disk. The head suspension includes a flexure. The flexure has a substrate made of a resilient stainless steel thin plate, a base insulating layer made of flexible resin formed on the substrate, wiring patterns formed on the base insulating layer and connected to terminals of a magnetic head, and a cover insulating layer made of flexible resin formed over the wiring patterns.

The flexure is assembled into a head suspension by, for example, clamping. During the assembling work, the surface of the cover insulating layer of the flexure may be rubbed to have positive or negative electrostatic charge. The electrostatic charge causes an electrostatic induction phenomenon to electrostatically charge the wiring patterns of the flexure. In addition, a slider on which a magnetic head is arranged may also be electrostatically charged. When attaching the slider to the head suspension, the wiring patterns of the flexure must be connected to terminals of the magnetic head. At this moment of connection, the electrostatic charge of the wiring patterns and slider is released at once, to deteriorate or destroy a read element of the magnetic head.

Recent hard disk drives employ sensitive magnetic heads such as MR heads and GMR heads, or more sensitive ones such as TuMR heads. These magnetic heads are vulnerable to disturbances such as electrostatic discharge (ESD), and therefore, there is a strong requirement for a measure to cope with ESD.

The present applicant has proposed in United States Patent Application Publication No. US2006/0187587A1 a technique of coping with an electrostatic discharge failure of a magnetic head. This technique forms a conductive flexible resin coating on the surface of a flexure over a read wiring pattern. Also, the present applicant has disclosed in United States Patent Application Publication No. US2006/0190673A1 a technique of forming a cover insulating layer on a flexure from slightly conductive flexible resin, the cover insulating layer and a base insulating layer sandwiching wiring patterns of the flexure. These related arts can prevent the deterioration and breakage of a read element caused by electrostatic discharge.

The inventors of the present invention have found through studies that the quality and reliability of a flexure are influenced not only by electrostatic discharge of the flexure but also by wire-to-wire or wire-to-substrate ion migration of the flexure. The ion migration is a phenomenon that ions move along a nonmetallic medium between wiring patterns or between wiring patterns and a metal substrate of the flexure. The ion migration and electrostatic discharge are trade-offs and are very difficult to simultaneously solve them. What is craved is an innovative technique capable of solving both the problems of ion migration and electrostatic discharge.

SUMMARY OF THE INVENTION

The inventors of the present invention have endeavored to develop a flexure capable of simultaneously solving the problems of electrostatic discharge and ion migration that are trade-offs. Through keen studies, the inventors have found that the related arts that try to solve only the problem of electrostatic discharge are ineffective to suppress ion migration. The inventors, therefore, have examined several flexure manufacturing techniques from different angles and have come to an idea of dipping a flexure into a solution of some conductive polymer and forming a conductive polymer layer on the surface of the flexure. After a great deal of trial and error, the inventors have found that forming a conductive polymer layer having a thickness in a certain range on a flexure results in providing the flexure with electrical characteristics that can solve both the problems of electrostatic discharge and ion migration. Thus, the inventors have come up with the present invention.

An object of the present invention is to provide a flexure capable of solving both the problems of electrostatic discharge and ion migration that are trade-offs.

Another object of the present invention is to provide a method of manufacturing a flexure that can eliminate electrostatic discharge, and at the same time, prevent ion migration.

Still another object of the present invention is to provide a head suspension provided with a flexure that can simultaneously solve the problems of electrostatic discharge and ion migration.

In order to accomplish the objects, a first aspect of the present invention provides a flexure having a substrate made of a thin conductive metal plate, a base insulating layer made of flexible resin formed on the substrate, wiring patterns formed on the base insulating layer and connected to a slider mount, and a cover insulating layer formed to cover the wiring patterns. The flexure comprises a layer of conductive polymer formed over the cover insulating layer, substrate, and wiring patterns. The thickness of the conductive polymer layer is determined according to a relationship between the properties of the conductive polymer and the thickness of the conductive polymer layer and a correlation between the thickness of the conductive polymer layer and the surface resistance of the flexure, so as to suppress electrostatic charge and ion migration on the flexure.

The thickness of the conductive polymer layer may be in the range of 18 to 130 nm.

The conductive polymer layer may be formed around the flexure except an area that includes the slider mount and the periphery thereof.

The conductive polymer may be a mixture of pi-electron-conjugated polymer and hydrophilic binder.

In order to accomplish the objects, a second aspect of the present invention provides a method of manufacturing a flexure, comprising preparing a flexure having a substrate made of a thin conductive metal plate, a base insulating layer made of flexible resin formed on the substrate, wiring patterns formed on the base insulating layer and connected to a slider mount, and a cover insulating layer formed to cover the wiring patterns; and applying a solution of conductive polymer to the flexure, to form a layer of the conductive polymer having a thickness in the range of 18 to 130 nm around the flexure.

Applying a solution of conductive polymer to the flexure may include coating the flexure with the solution of conductive polymer or spraying the solution of conductive polymer over the flexure.

Applying a solution of conductive polymer to the flexure may apply the solution of conductive polymer over the flexure except an area that includes the slider mount and the periphery thereof, to coat the flexure with a layer of the conductive polymer except the area that includes the slider mount and the periphery thereof.

In order to accomplish the objects, a third aspect of the present invention provides a method of manufacturing a flexure, comprising preparing a flexure having a substrate made of a thin conductive metal plate, a base insulating layer made of flexible resin formed on the substrate, wiring patterns formed on the base insulating layer and connected to a slider mount, and a cover insulating layer formed to cover the wiring patterns; dipping the flexure in a solution of conductive polymer; and carrying out a film forming process with respect to the solution of conductive polymer adhering to the flexure, to form a layer of the conductive polymer having a thickness in the range of 18 to 130 nm around the flexure.

The film forming process may employ one of an air squeegee technique and a spin coater technique.

The film forming process may dip the flexure in a poor solvent of the conductive polymer.

The poor solvent may be one or a combination of at least two selected from the group consisting of low-molecular-weight alcohol, low-molecular-weight ketone, and low-molecular-weight ester.

Dipping the flexure in a solution of conductive polymer may dip the flexure in the solution of conductive polymer except an area that includes the slider mount and the periphery thereof, to coat the flexure with a layer of the conductive polymer except the area that includes the slider mount and the periphery thereof.

The solution of conductive polymer may be a mixture of pi-electron-conjugated polymer and hydrophilic binder.

In order to accomplish the objects, a fourth aspect of the present invention provides a head suspension comprising the flexure of the first aspect.

In this way, the flexure according to the first aspect of the present invention has the conductive polymer layer that covers the cover insulating layer, wiring patterns, and substrate of the flexure. The thickness of the conductive polymer layer is determined according to a relationship between the properties of the conductive polymer and the thickness of the conductive polymer layer and a correlation between the thickness of the conductive polymer layer and the surface resistance of the flexure, so that the flexure may solve the problems of electrostatic discharge and ion migration. The quality and reliability of the flexure are appropriate for eliminating the problems of electrostatic discharge and ion migration that are trade-offs. Namely, the flexure according to the first aspect can avoid both the problems of electrostatic discharge and ion migration.

The method according to the second aspect of the present invention prepares a flexure having a substrate made of a thin conductive metal plate, a base insulating layer made of flexible resin formed on the substrate, wiring patterns formed on the base insulating layer and connected to a slider mount, and a cover insulating layer formed to cover the wiring patterns and applies a solution of conductive polymer to the flexure, to form a layer of the conductive polymer having a thickness in the range of 18 to 130 nm around the flexure. The flexure thus formed can prevent the deterioration or failure of a magnetic head to which the flexure is connected. Namely, the second aspect improves the yield of head suspensions in which magnetic heads and flexures are arranged. The second aspect also provides an effect of preventing the flexure from attaching to a carrier tool due to static electricity, thereby improving the yield of head suspensions.

The method according to the third aspect of the present invention prepares a flexure having a substrate made of a thin conductive metal plate, a base insulating layer made of flexible resin formed on the substrate, wiring patterns formed on the base insulating layer and connected to a slider mount, and a cover insulating layer formed to cover the wiring patterns, dips the flexure in a solution of conductive polymer, and carries out a film forming process with respect to the solution of conductive polymer adhering to the flexure, to form a layer of the conductive polymer having a thickness in the range of 18 to 130 nm around the flexure. The conductive polymer layer thus formed is flat, smooth, and uniform and has a fine appearance. The flexure of the third aspect can prevent the deterioration or failure of a magnetic head to which the flexure is connected. Namely, the third aspect improves the yield of head suspensions in which magnetic heads and flexures are arranged. The third aspect also provides an effect of preventing the flexure from attaching to a carrier tool due to static electricity, thereby improving the yield of head suspensions.

The head suspension according to the fourth aspect of the present invention incorporates the flexure whose quality and reliability are appropriate for preventing electrostatic discharge and ion migration that are trade-offs. The head suspension of the fourth aspect, therefore, can simultaneously solve the problems of electrostatic discharge and ion migration, and at the same time, can minimize a transmission loss.

BRIEF DESCRIPTION OF THE DRAWINGS

FIG. 15 is a table showing the thicknesses of conductive polymer layers and wiring-substrate surface resistance values of flexures according to various examples and comparative examples;

DETAILED DESCRIPTION OF EMBODIMENTS

A flexure, a method of manufacturing a flexure, and a head suspension incorporating a flexure, according to embodiments of the present invention will be explained in detail with reference to the drawings.

[General Configuration of Flexure]

Figure 1:
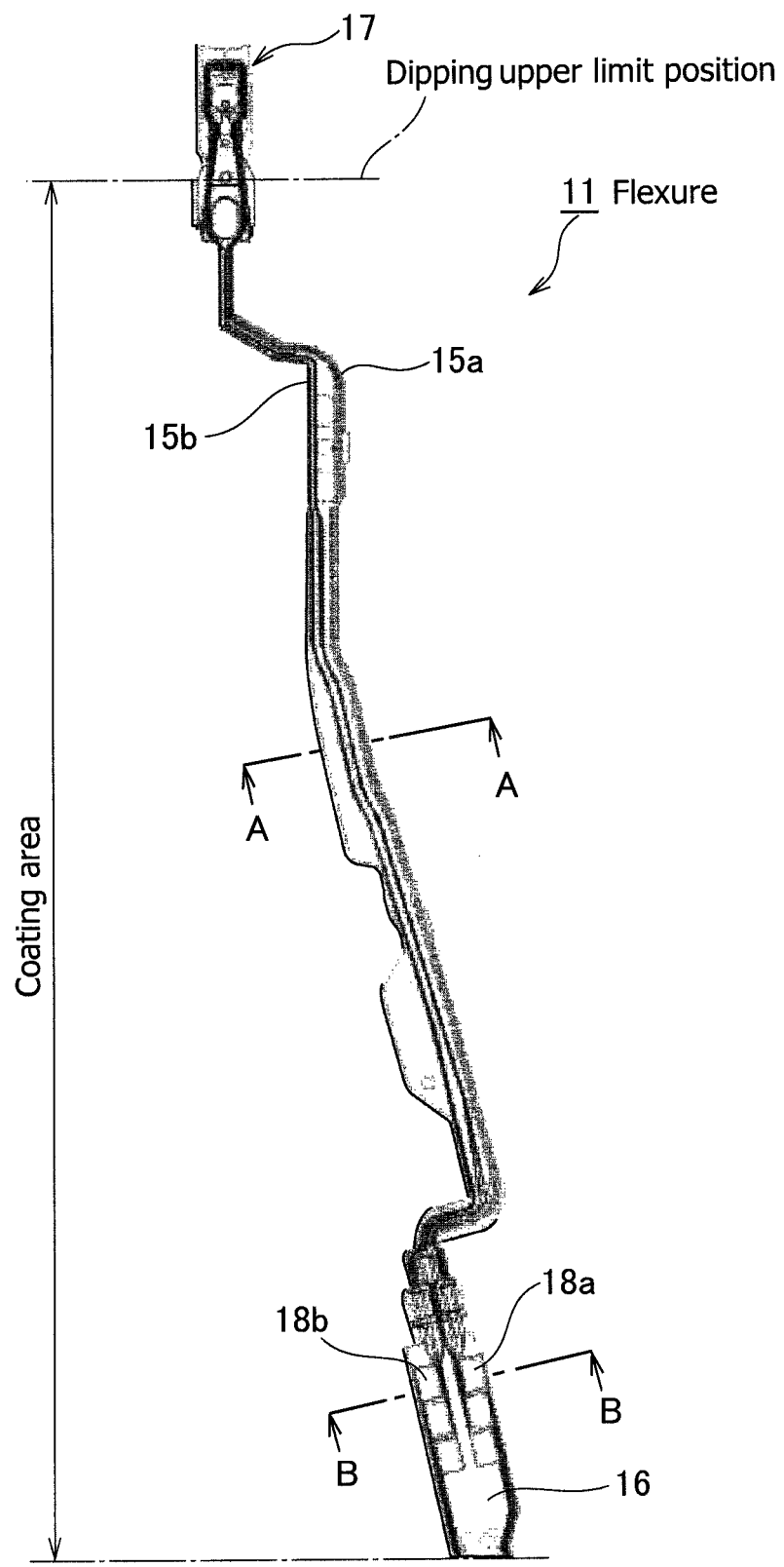
FIG. 1 is a plan view generally showing a flexure according to an embodiment of the present invention.
Figure 2:
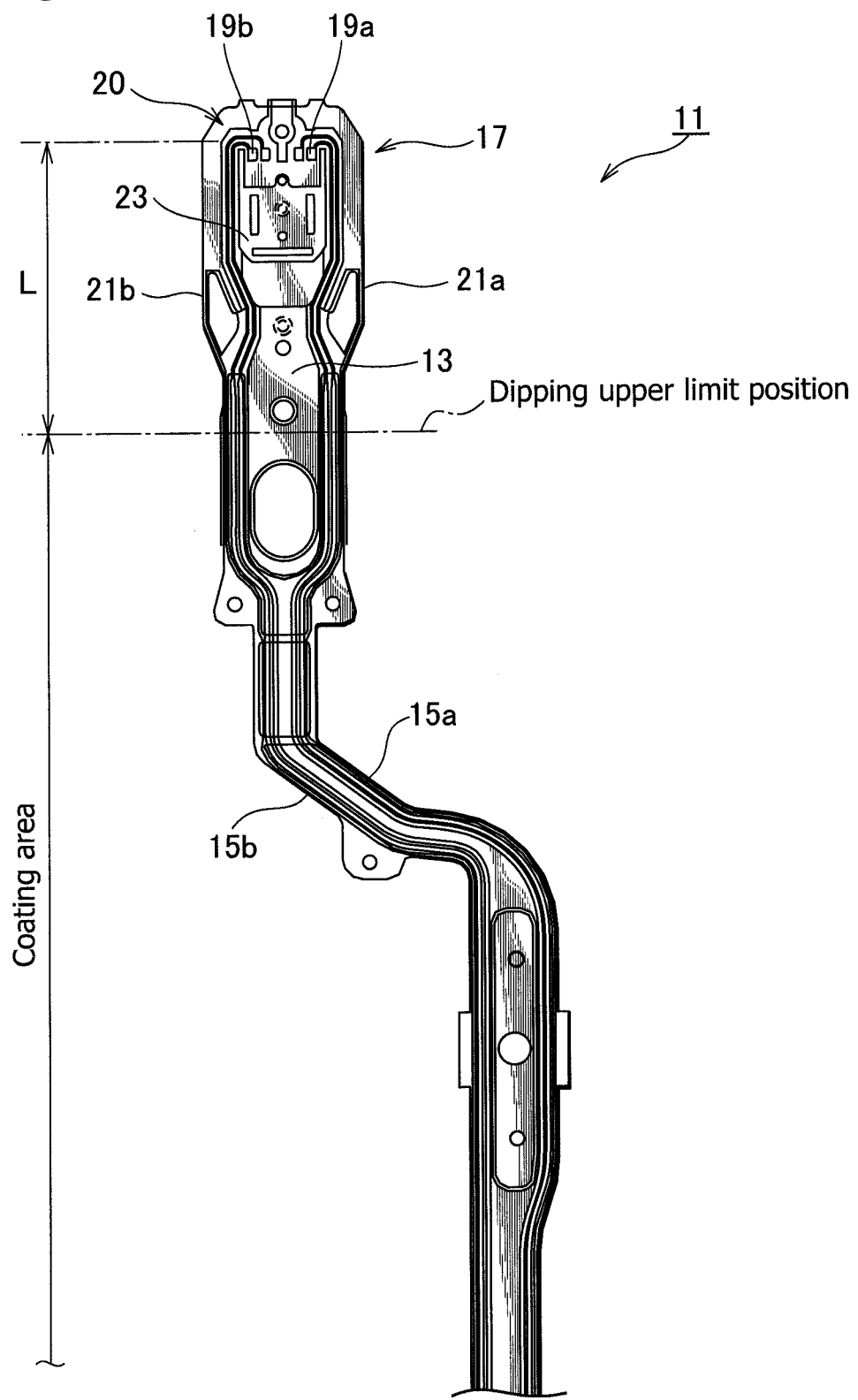
FIG. 2 is a plan view showing a slider mount of the flexure of FIG. 1.
Figure 3:
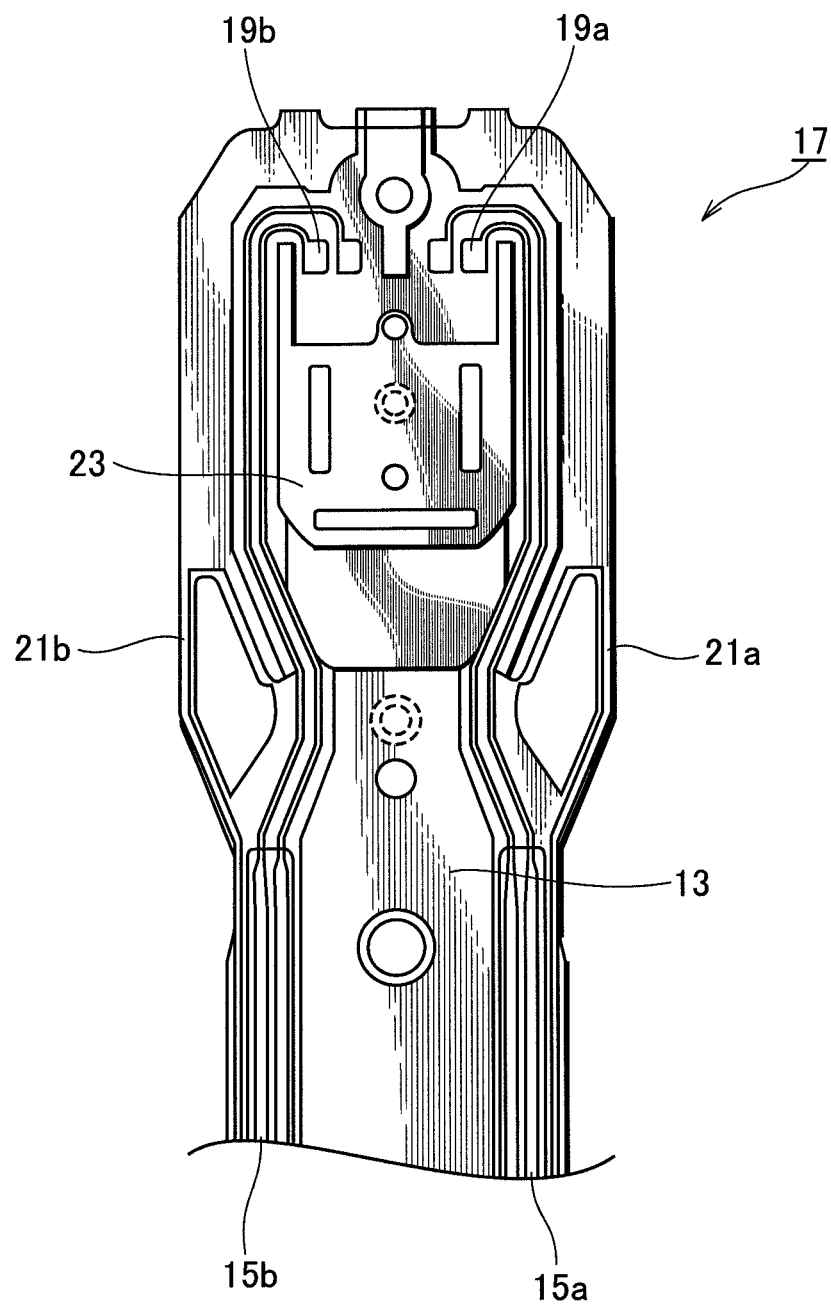
FIG. 3 is a plan view showing the details of the slider mount of FIG. 2.

FIGS. 1 and 2 show a flexure 11 according to an embodiment of the present invention. The flexure 11 has a substrate 13 made of a thin conductive metal plate such as a thin resilient stainless steel rolled plate (SST) having a thickness of about 20 μm. On the substrate 13, a base insulating layer 31 (to be explained later) is formed. On the base insulating layer 31, a write wiring pattern 15a and a read wiring pattern 15b are formed. A first end of the wiring pattern 15a is connected to a write terminal 19a of a slider mount 17 and a first end of the wiring pattern 15b is connected to a read terminal 19b of the slider mount 17. A second end of the wiring pattern 15a is connected to a terminal 18a formed on a base 16 of the flexure 11 and a second end of the wiring pattern 15b is connected to a terminal 18b formed on the base 16 of the flexure 11.

The slider mount 17 includes outriggers 21a and 21b that can bend in thickness directions of the flexure 11. The slider mount 17 also includes a tongue 23 supported like a cantilever by the outriggers 21a and 21b. The tongue 23 supports a write/read slider (not shown). The slider has terminals that correspond to the terminals 19a and 19b and are connected to write and read elements.

The read element of the slider may be a magnetoelectric element to convert electric and magnetic signals from one to another, such as an MR element, a GMR element, or a TuMr element. The magnetoelectric element reads data from a hard disk and converts the read data into an electric signal, which is transmitted through the read wiring pattern 15b to a data processing circuit (not shown). To write data into the hard disk, an electric signal representative of the write data is transmitted from the data processing circuit to the write wiring pattern 15a and to a magnetoelectric element serving as the write element.

[Insulating Layer]

Figure 4:
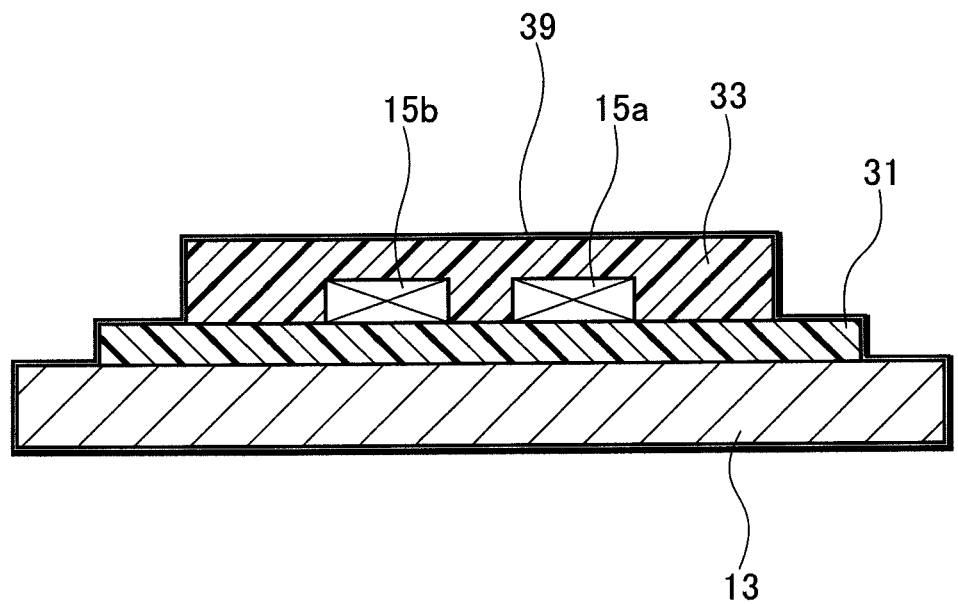
FIG. 4 is an enlarged sectional view taken along a line A-A of FIG. 1.

In FIG. 4, the base insulating layer 31 is made of flexible resin and is formed on the substrate 13 of the flexure 11. On the base insulating layer 31, the write and read wiring patterns 15a and 15b are formed. The write wiring pattern 15a is a first wiring pattern and consists of, for example, a pair of wires. The read wiring pattern 15b is a second wiring pattern and consists of, for example, a pair of wires. These wires may be prepared by forming a thin plate of conductive material such as copper on the base insulating layer 31 and etching the thin plate into required wiring patterns, or by plating the base insulating layer 31 with a copper layer having required wiring patterns.

The base insulating layer 31 is made of flexible resin such as polyimide and has a thickness of about 10 μm. The base insulating layer 31 has a surface resistivity of about $10^{14}\Omega/\square$. With this high resistivity, the base insulating layer 31 realizes electrical insulation.

The wiring patterns 15a and 15b are covered with a cover insulating layer 33 except some parts. Namely, the wiring patterns 15a and 15b are sandwiched between the base insulating layer 31 and the cover insulating layer 33. The cover insulating layer 33 is made of resin such as polyimide and has a thickness of about 20 μm in the direction in which the base insulating layer 31 is laminated. By covering the surfaces of the wiring patterns 15a and 15b, the cover insulating layer 33 protects the wiring patterns 15a and 15b from external force. The cover insulating layer 33 has a surface resistivity in the range of, for example, $10^{11}$ to $10^{16}\Omega/\square$ that is sufficiently high to block external interference for circuit operation.

Figure 5:
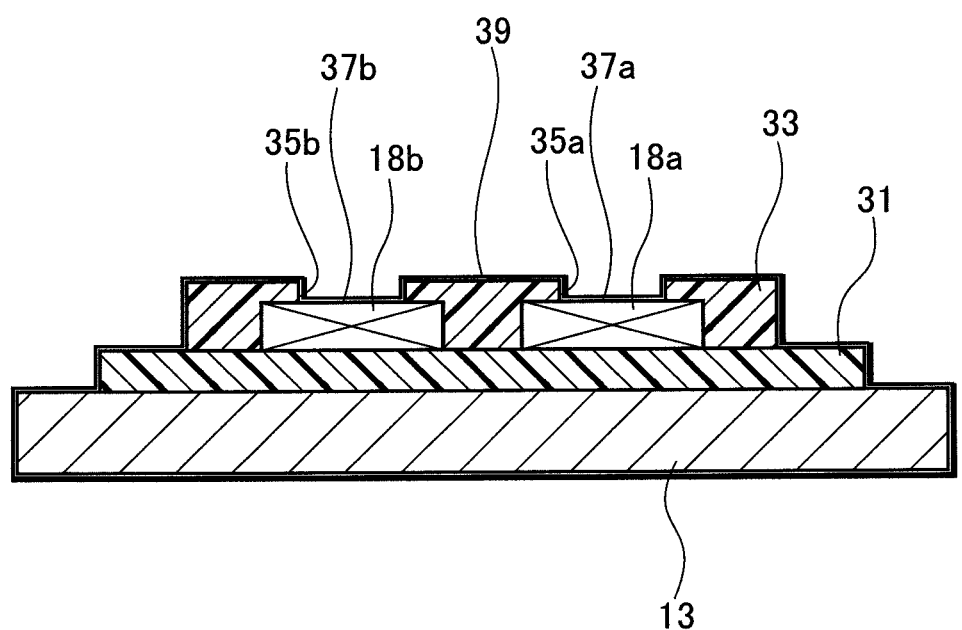
FIG. 5 is an enlarged sectional view taken along a line B-B of FIG. 1.

At the base 16 of the flexure 11 shown in FIGS. 1 and 5, the cover insulating layer 33 has a hole 35a to expose the first connection terminal 18a of the first wiring pattern 15a and a hole 35b to expose the second connection terminal 18b of the second wiring pattern 15b. The terminals 18a and 18b have gold-plated surfaces 37a and 37b to reduce contact resistance with respect to external terminals (not shown).

[Conductive Polymer Layer]

In FIGS. 4 and 5, the flexure 11 is substantially coated with a conductive polymer layer 39 having a uniform thickness in the range of 18 to 130 nm. To suppress ion migration, it is preferable not to cover the slider mount 17 and the periphery thereof with the conductive polymer layer 39. This is because the slider mount 17 and the periphery thereof, in particular, the vicinities of the slider pads (terminals) 19a and 19b (FIG. 2) involve concentrated wires, and if these parts are coated with the conductive polymer layer 39, ion migration will accelerate. With the conductive polymer layer 39, the flexure 11 has a surface resistance value in the range of about $5E9\Omega$ (corresponding to a film thickness of 18 nm) to $1E7\Omega$ (corresponding to a film thickness of 130 nm). With the conductive polymer layer 39, the flexure 11 can surely solve both the problems of electrostatic discharge and ion migration.

[Method of Manufacturing Flexure]

Figure 6:
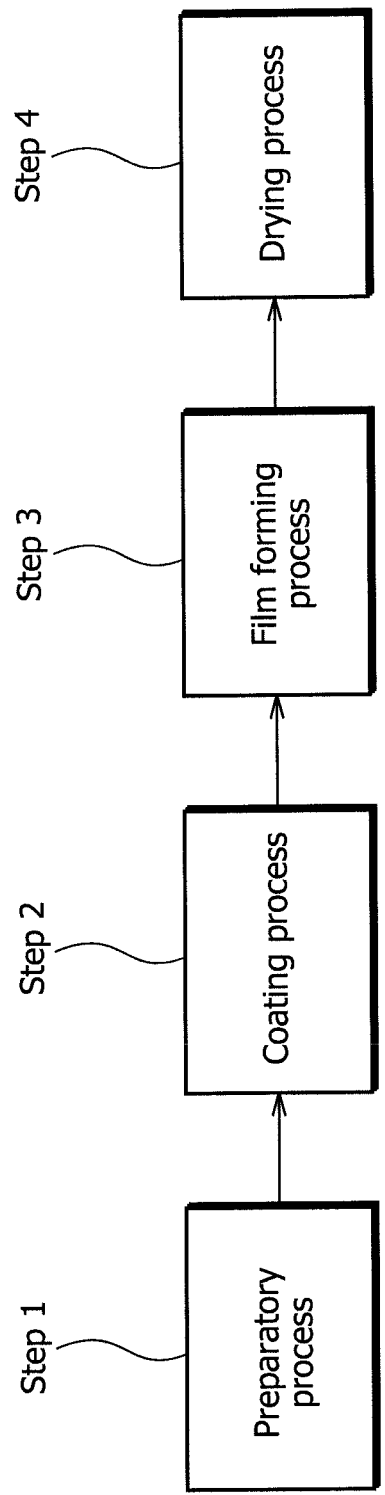
FIG. 6 is a view showing processing steps of a flexure manufacturing method according to an embodiment of the present invention.

A method of manufacturing the flexure 11 will be explained with reference to FIG. 6. This method employs a dipping technique.

Step 1 is a preparatory step to receive a sheet of semifinished flexures. The sheet consists of, for example, a stainless steel rolled plate of 15 to 30 μm thick serving as substrates 13, a polyimide insulating film of 5 to 20 μm thick serving as base insulating layers 31, a copper (Cu) film of 5 to 20 μm thick serving as wiring patterns 15a and 15b, and an insulating film covering the Cu film and serving as cover insulating layers 33. These plate and films are in predetermined shapes and are sequentially laminated to form the sheet. The top and bottom surfaces of the sheet are cleaned by plasma cleaning, to remove dust and the like from the sheet. The sheet is cut into frames each including a chain of flexures. The frames are set on individual jigs to improve the handling thereof. At this time, each frame is set so that the slider mount 17 of each flexure comes to the top side. The individual jigs are set on a common jig.

Step 2 is a coating process in which the frames on the individual jigs are dipped into a solution of conductive polymer (to be explained later). At this time, as shown in FIGS. 1 and 2, the slider mount 17 of each flexure and the periphery of the slider mount 17 must not be dipped in the solution, so that each flexure is coated with a conductive polymer layer 39 except the slider mount 17 and the periphery thereof.

As shown in FIG. 2, there is a concentration of wires in an area around the slider pads 19a and 19b of the slider mount 17. Excluding this area from the conductive polymer coating 39 results in providing the flexure 11 with an ion migration suppressing effect. In practice, dipping the frame with a plurality of flexures into the conductive polymer solution causes the solution to crawl upward along the surface of the frame. This phenomenon occurs around the slider mount 17 in particular. If the frame is dipped into the conductive polymer solution up to the vicinities of the slider pads 19a and 19b, the solution will crawl and reach the slider pads 19a and 19b. To prevent this, a dipping upper limit position is set at a distance L away from the slider pads 19a and 19b as shown in FIG. 2, so that each flexure is dipped into the solution up to the upper limit position without wetting the slider mount 17 and the periphery thereof with the solution.

To control the thickness of the conductive polymer layer 39 on the surface of the frame (flexures), the concentration of the conductive polymer in the solution is adjusted. The conductive polymer solution is made by mixing the conductive polymer with an aqueous solvent. To thin the layer 39, the concentration of the conductive polymer in the solution is reduced, and to thicken the layer 39, the concentration of the conductive polymer in the solution is increased.

Instead of dipping the frame with flexures into a conductive polymer solution, the coating process of step 2 may apply or spray a conductive polymer solution over the frame.

Step 3 is a film forming process. The frames on each individual jig are dipped into a poor solvent (to be explained later). At this time, like the coating process of step 2, the slider mount 17 and the periphery thereof of each flexure must not be dipped into the poor solvent. The poor solvent absorbs water of the conductive polymer solution adhering to each flexure, to thereby form the conductive polymer layer 39 around each flexure. The film forming technique using a poor solvent makes the frame with flexures contact only with the poor solvent, thereby keeping the frame clean and uniformizing the thickness of a conductive polymer layer to be formed around the frame. Once the frame is dried, the frame will have a conductive polymer layer that is uniform and has an excellent appearance. The appearance of the conductive polymer layer around the frame is very important. If the surface of the conductive polymer layer on the frame has dust or wrinkles, the frame must be discarded as unacceptable.

Instead of the poor solvent dipping technique, the film forming process of step 3 may employ an air squeegee technique or a spin coater technique, to form a uniform conductive polymer layer around the frame and remove an excess of conductive polymer solution from the frame. The air squeegee technique blows air to the conductive polymer solution adhering to the surface of the frame, to uniformize the conductive polymer layer around the frame and remove an excess of conductive polymer solution without touching the surface of the frame. Namely, the air squeegee technique can keep the surface of the frame clean. Like the poor solvent dipping technique carried out in the film forming process of step 3, the air squeegee technique can form a conductive polymer layer that is smooth and uniform and has an excellent appearance.

Step 4 is a drying process. The frames on the individual jigs processed through the poor solvent dipping technique in the film forming process of step 3 are set on a common jig and are set in an oven where the frames are dried. The dried frames are sampled and tested in appearance, resistance, and the like, and if pass the tests, serve to provide finished flexures.

[Conductive Polymer Solution and Poor Solvent]

A solution of conductive polymer applicable to the present invention is formed by solving or dispersing pi-electron-conjugated polymer such as polyaniline, polythiophen, and polypyrrole in an aqueous solvent.

The pi-electron-conjugated polymer is a polymer in which every bond is a conjugated double bond, such as polyacetylene, polyparaphenylene, polyparaphenylene vinylene, polyphenylene sulfide, polypyrrole, polythiophene, polyaniline, and the like. Among them, poly-3, 4-ethylene-dioxi-thiophene is preferable because it has high conductivity and provides an excellent finished appearance. According to an embodiment of the present invention, poly-3, 4-ethylene-dioxi-thiophene is preferable as the conductive polymer.

If a flexure is coated with conductive polymer alone, adhesion between the flexure and the conductive polymer will be insufficient. To secure adhesion of conductive polymer to the surface of a flexure, it is preferable to employ a polymeric binder. The polymeric binder is preferably a water-dispersing or water-soluble hydrophilic binder. It may contain a solvent other than water, such as an alcohol-based solvent. If necessary, the binder may contain a surfactant, an antifoam, a film formation adjuster, and the like to adjust the wetness of the binder.

The hydrophilic binder may be water-soluble acryl-styrene-based resin such as BURNOCK WE-306 and DNW-5000 (Dainippon Ink Kagaku Kogyo K.K.), or aqueous acryl-based resin such as WATERSOL AC-1124 and S-701 (Dainippon Ink Kagaku Kogyo K.K.), or water-soluble polyester resin such as WB-630-25 (Senshou Kasei K.K.) and VYLONAL (Toyo Boseki K.K.).

The poor solvent is preferably a water-soluble monomeric solvent such as monomeric alcohol including methanol, ethanol, and isopropyl alcohol, or monomeric ketone such as acetone and methyl ethyl ketone, or monomeric ether such as tetrahydrofuran and dioxane. Among them, monomeric alcohol and monomeric ketone are preferable.

[Static Elimination—Mechanism]

The flexure 11 prepared according to the above-mentioned dipping technique has a function of eliminating static electricity to prevent electrostatic accumulation. A mechanism of static elimination will be explained with reference to FIGS. 7 and 8.

Figure 7:
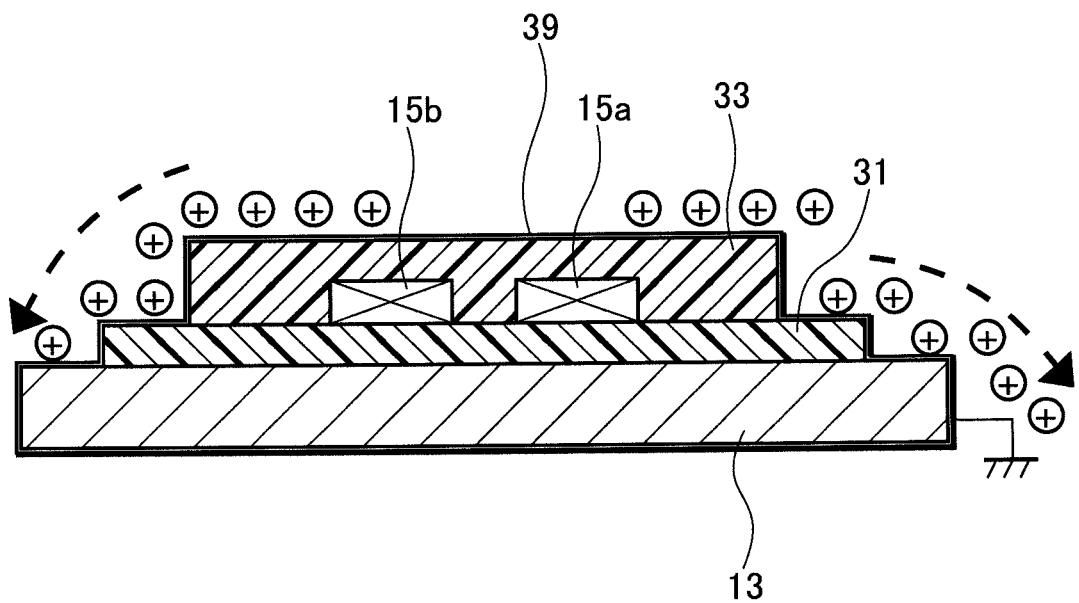
FIG. 7 is a view corresponding to FIG. 4, explaining a mechanism of static elimination.

In FIG. 7, the cover insulating layer 33 is charged with positive static electricity when it is rubbed during, for example, a clamping work of the flexure 11 to a head suspension. The positive static electricity is quickly discharged through the conductive polymer layer 39 covering the cover insulating layer 33 to a ground terminal of the substrate 13.

Figure 8:
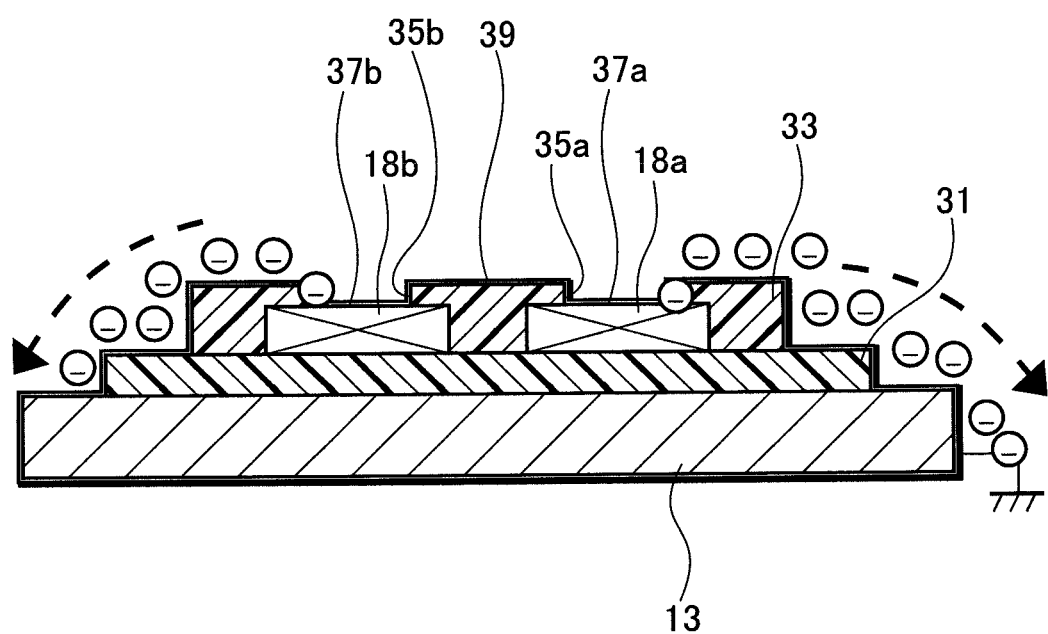
FIG. 8 is a view corresponding to FIG. 5, explaining a mechanism of static elimination.

In FIG. 8, the wiring patterns 15a and 15b are charged with negative static electricity due to positive charge on the surface of the cover insulating layer 33. The negative static electricity is discharged through the gold-plated surfaces 37a and 37b of the terminals 18a and 18b and the conductive polymer layer 39 on the cover insulating layer 33 to the ground terminal of the substrate 13.

Consequently, when the slider pads 19a and 19b of the slider mount 17 are connected to terminals of a magnetic head during a magnetic head assembling work, no static electricity is discharged from the slider pads 19a and 19b (wiring patterns 15a and 15b) or from the magnetic head, thereby preventing the deterioration or breakage of a read element of the magnetic head.

[Static Elimination—Influence of Conductive Polymer Layer on Surface Resistance]

In connection with the static elimination characteristic of the flexure 11, an influence of the conductive polymer layer 39 on the surface resistance of the flexure 11 will be explained with reference to FIG. 9.

Figure 9:
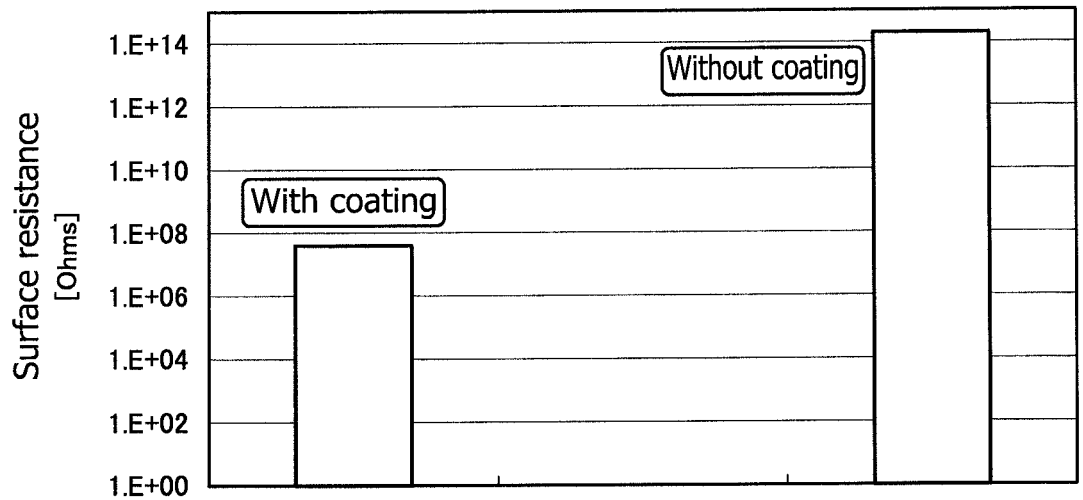
FIG. 9 is a graph showing the surface resistance values of flexures with/without a conductive polymer coating.

In FIG. 9, a flexure without the conductive polymer coating shows a very high surface resistance value of about 1E+14Ω. On the other hand, a flexure with the conductive polymer coating shows a remarkably reduced surface resistance value of about 1E+8Ω. It is understand from the data that the conductive polymer layer 39 greatly contributes to reduce the surface resistance of the flexure 11.

[Static Elimination—Surface Resistance and Static Elimination]

In connection with the static elimination characteristic of the flexure 11, a relationship between surface resistance and static elimination effect will be explained with reference to FIGS. 10, 11, and 12.

Figure 10:
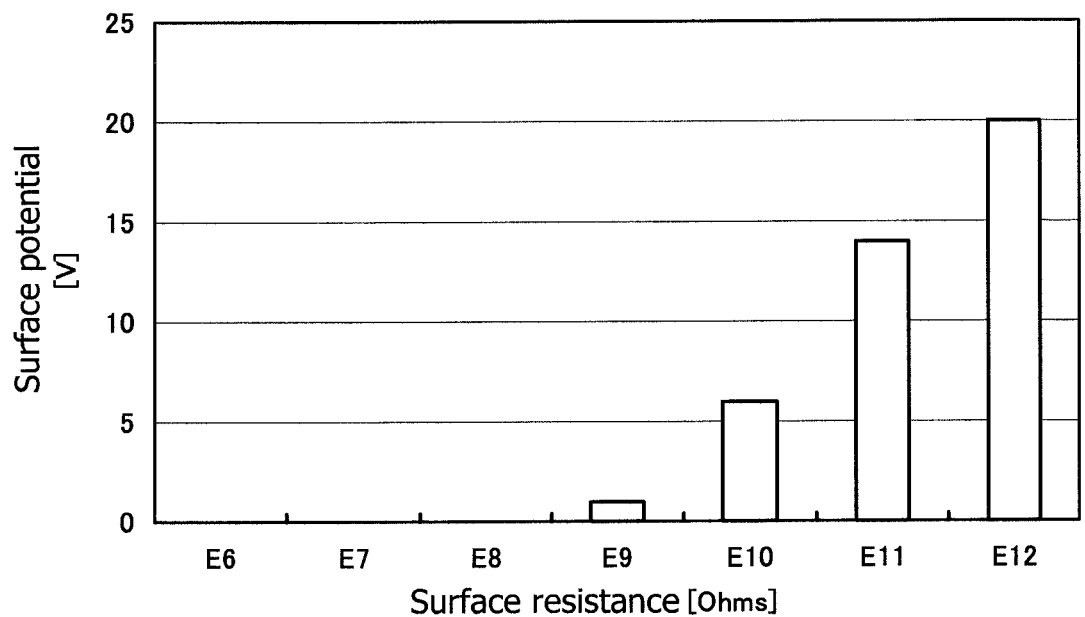
FIG. 10 is a graph showing a relationship between surface potential and cover-substrate surface resistance of a flexure.

FIG. 10 shows a relationship between surface resistance and surface potential. If a surface resistance value between the cover insulating layer 33 and the substrate 13 (hereinafter referred to as "cover-substrate surface resistance") exceeds 1.E+10Ω, the surface of the cover insulating layer 33 generates a high voltage that may critically damage a read element of a magnetic head when the cover insulating layer 33 is rubbed with, for example, a carrier jig. If the cover-substrate surface resistance is equal to or lower than 1.E+9Ω, no static electricity accumulates on the surface of the cover insulating layer 33 and a potential generated at the surface of the cover insulating layer 33 is 1 V or lower to cause no damage on a read element of a magnetic head.

Figure 11:
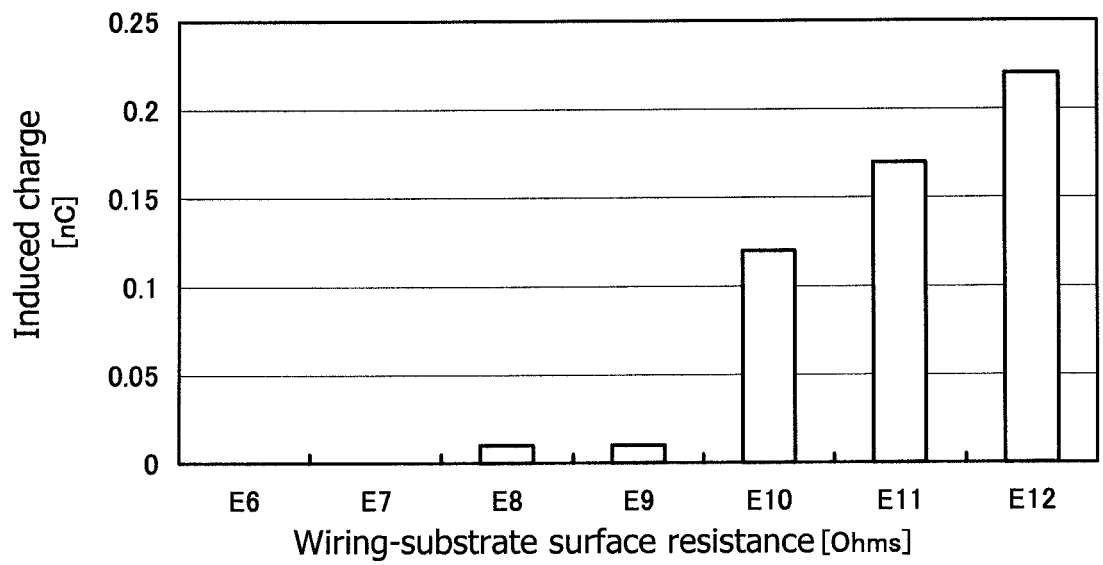
FIG. 11 is a graph showing a relationship between induced charge and wiring-substrate surface resistance of a flexure.

FIG. 11 shows a relationship between surface resistance between the wiring patterns 15a and 15b and the substrate 13 (hereinafter referred to as "wiring-substrate surface resistance") and induced charge. If the wiring-substrate surface resistance exceeds E 10Ω, the induced charge amount of the wiring patterns 15a and 15b becomes larger than 0.1 nanocoulombs (nC), the induced charge of the wiring patterns being caused by charge accumulated on the surface of the cover insulating layer 33 when it is rubbed with, for example, a jig. If the wiring-substrate surface resistance is equal to or lower than E9Ω, the induced charge amount of the wiring patterns greatly decreases to 0.01 nanocoulombs (nC) or lower. It is understood from the data that the surface resistance value of the flexure 11 must be set to make the wiring-substrate surface resistance lower than E9Ω, to minimize the induced charge amount of the wiring patterns.

Figure 12:
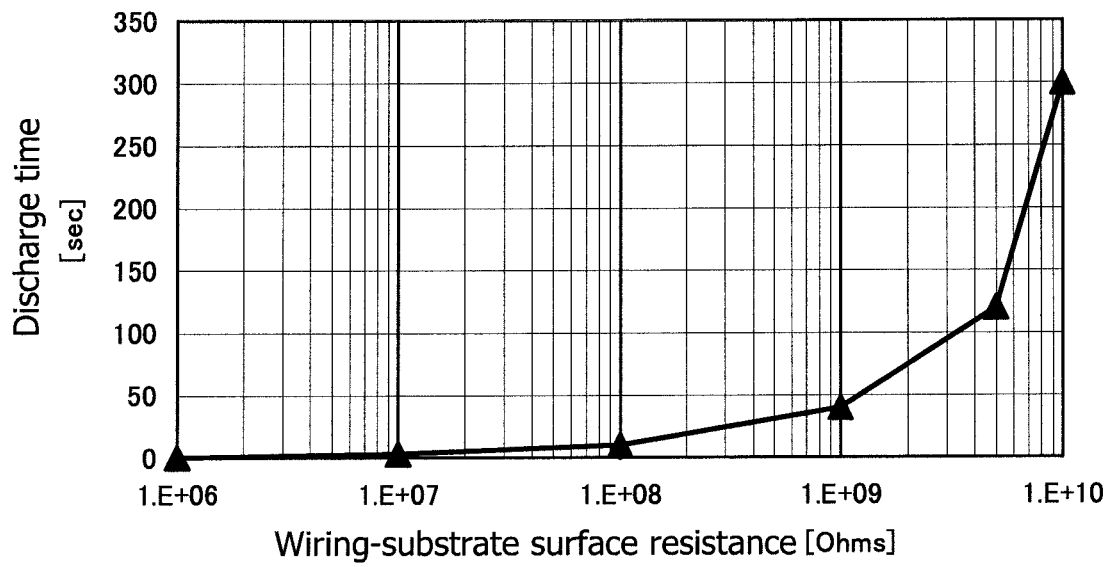
FIG. 12 is a graph showing a relationship between discharge time and wiring-substrate surface resistance of a flexure, the discharge time being a period from applying a charge of 0.1 nanocoulombs to the wiring of a flexure from a coulomb meter probe up to when the charge of the wiring becomes zero.

FIG. 12 shows a relationship between wiring-substrate surface resistance and discharge time. If the wiring-substrate surface resistance exceeds 1.E+9Ω, a necessary discharge time exceeds 100 seconds. If the wiring-substrate surface resistance is lower than 1.E+9Ω, the necessary discharge time greatly decreases to 50 seconds or shorter. It is understood from the data that the surface resistance value of the flexure 11 must be set to make the wiring-substrate surface resistance lower than E9Ω, to minimize a discharge time.

[Environment Resistance—Ion Migration Endurance]

Figure 13:
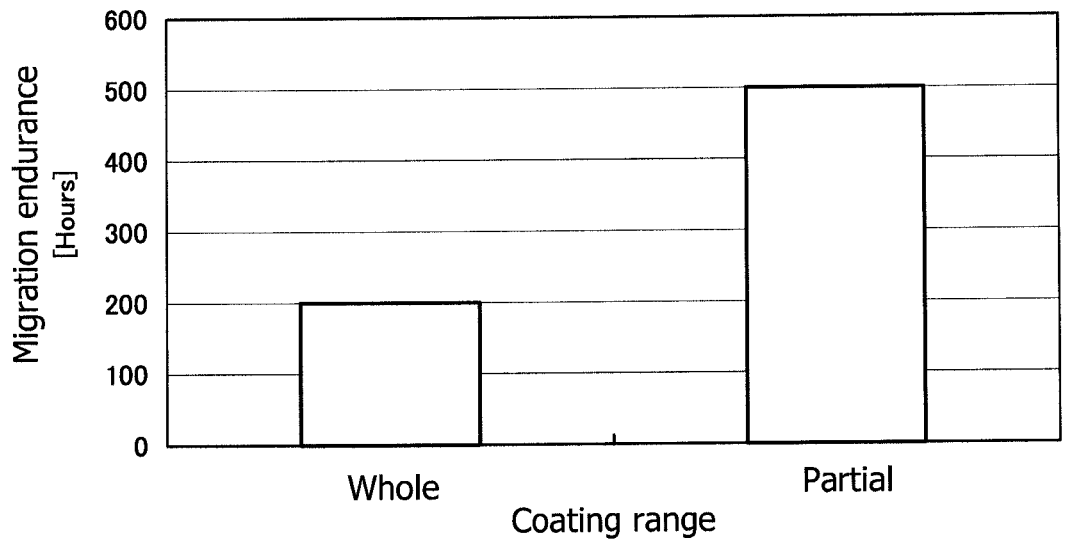
FIG. 13 is a graph showing the ion migration endurance of flexures with entire/partial conductive polymer coatings.

In connection with environment resistance of the flexure 11, an influence of the conductive polymer layer 39 on ion migration endurance of the flexure 11 will be explained with reference to FIG. 13. FIG. 13 shows two cases, one entirely coating the flexure 11 with the conductive polymer layer 39 and the other partially coating the flexure 11 with the conductive polymer layer 39 excluding the slider mount 17.

In FIG. 13, the entirely coated flexure 11 shows an ion migration phenomenon about 200 hours after the start of the test. On the other hand, the partially coated flexure 11 shows an ion migration endurance of over 500 hours after the start of the test. It is understood from the data that coating the flexure 11 with the conductive polymer layer 39 except the slider mount 17 greatly contributes to improve the ion migration endurance of the flexure 11.

[Electrical Characteristic—Transmission Loss]

Figure 14:
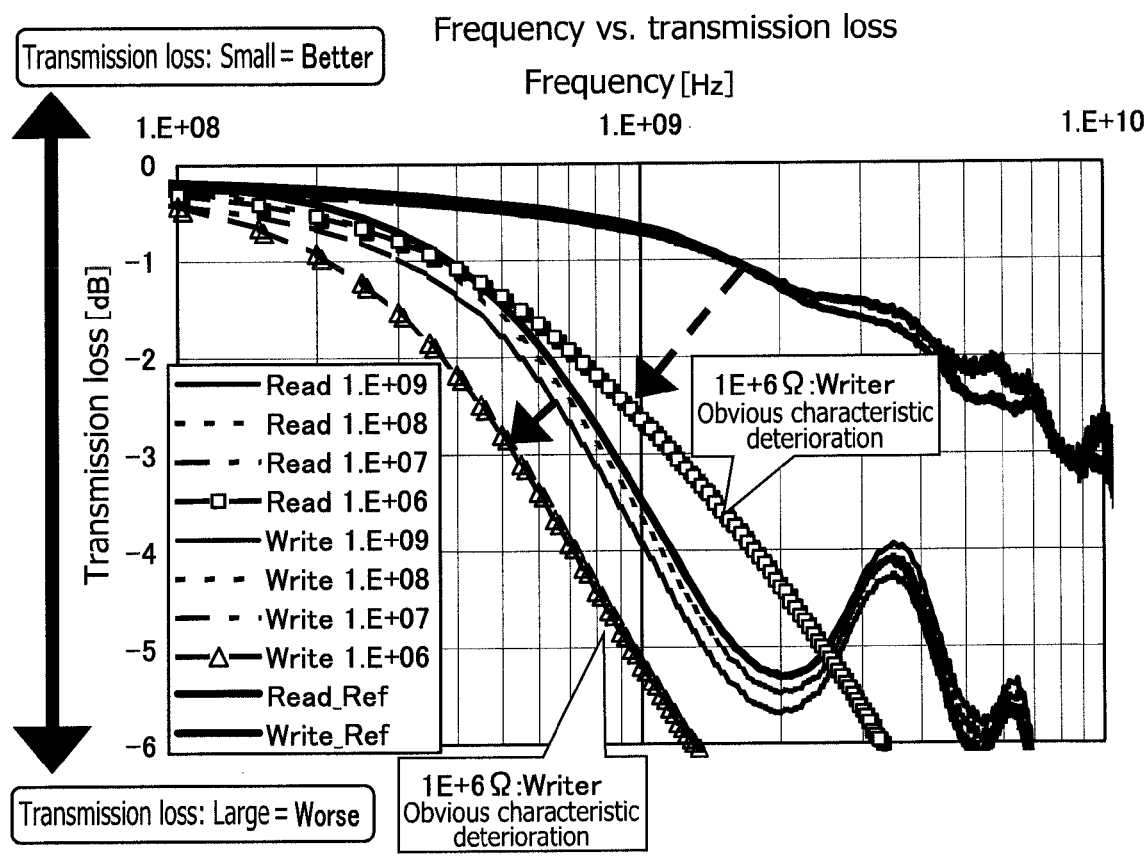
FIG. 14 is a graph showing a relationship between transmission loss and wiring-substrate surface resistance of a flexure.

Among the electrical characteristics of the flexure 11, frequency-wise transmission loss and surface resistance will be explained with reference to FIG. 14.

With a wiring-substrate surface resistance of E+7 (E7) Ω or higher, the flexure 11 shows a proper transmission loss-frequency curve that descends rightward. With a wiring-substrate surface resistance of E6Ω, the flexure 11 shows a deteriorated transmission loss-frequency curve that involves worsened transmission loss at high frequencies in particular. This is because the conductive polymer layer 39 of the flexure 11 having the wiring-substrate surface resistance of E6Ω is thick, i.e., about 200 nm to increase parasitic capacitance components. It is understood from the data that the surface resistance of the flexure 11 must be set to make the wiring-substrate surface resistance larger than 1.E+7 (E7) Ω, to suppress a transmission loss.

[Electrical Characteristics—Summary]

To summarize various characteristics of the flexure 11, a correlation between the thickness of the conductive polymer layer 39 and the wiring-substrate surface resistance of the flexure 11 will be examined. Also, the reason why the thickness of the conductive polymer layer 39 must be in the range of 18 to 130 nm will be explained.

Correlation Between Layer Thickness and Wiring-Substrate Surface Resistance

Example 1

With the above-mentioned manufacturing method, a flexure (11) is prepared by dipping it in a conductive polymer solution except a slider mount of the flexure. The flexure has a conductive polymer layer (39) of 18.7 nm thick and a wiring-substrate surface resistance of 5.E+9Ω as shown in FIGS. 15 and 16.

Example 2

Figure 16:
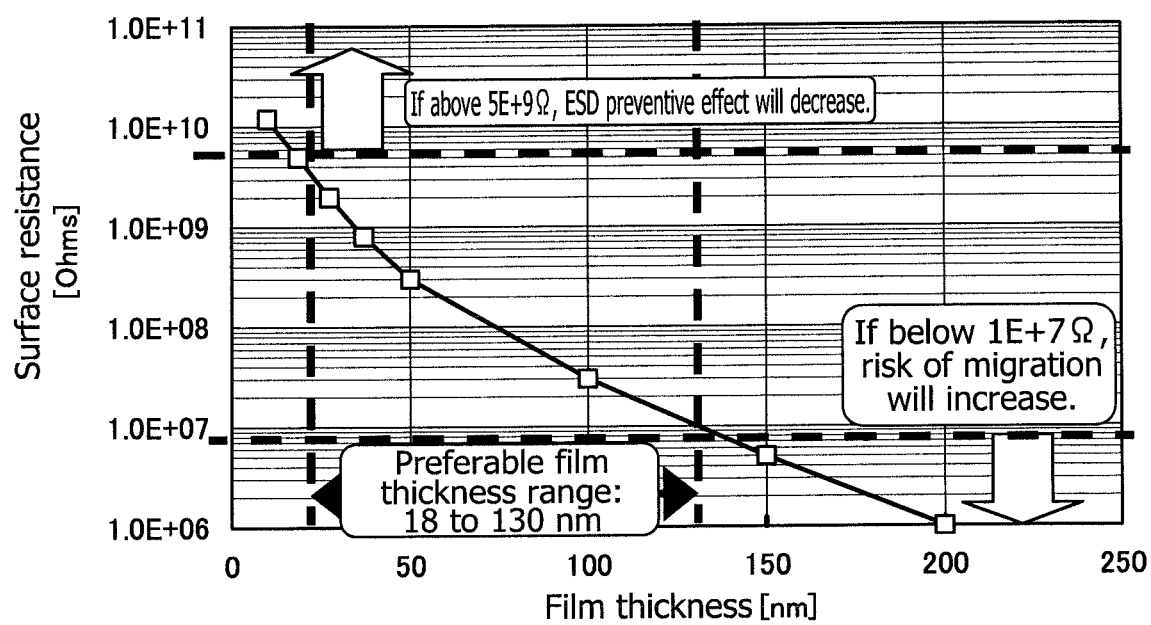
FIG. 16 is a graph showing a relationship between conductive polymer layer thickness and wiring-substrate surface resistance of a flexure.

With the same manufacturing method as that for Example 1, a flexure (11) is prepared to have a conductive polymer layer (39) of 27.3 nm thick and a wiring-substrate surface resistance of 2.E+9Ω as shown in FIGS. 15 and 16.

Example 3

With the same manufacturing method as that for Example 1, a flexure (11) is prepared to have a conductive polymer layer (39) of 37 nm thick and a wiring-substrate surface resistance of 8.E+8Ω as shown in FIGS. 15 and 16.

Example 4

With the same manufacturing method as that for Example 1, a flexure (11) is prepared to have a conductive polymer layer (39) of 100 nm thick and a wiring-substrate surface resistance of 3.E+7Ω as shown in FIGS. 15 and 16.

Example 5

Best Implementation

With the same manufacturing method as that for Example 1, a flexure (11) is prepared to have a conductive polymer layer (39) of 50 nm thick and a wiring-substrate surface resistance of 3.E+8Ω as shown in FIGS. 15 and 16.

Comparative Example 1

To compare with Examples 1 to 5, the same manufacturing method as that for Example 1 is used to prepare a flexure (11) having a conductive polymer layer (39) of 10 nm thick and a wiring-substrate surface resistance of $1.2E+10\Omega$ as shown in FIGS. 15 and 16.

Comparative Example 2

To compare with Examples 1 to 5, the same manufacturing method as that for Example 1 is used to prepare a flexure (11) having a conductive polymer layer (39) of 150 nm thick and a wiring-substrate surface resistance of $5.E+6\Omega$ as shown in FIGS. 15 and 16.

Comparative Example 3

To compare with Examples 1 to 5, the same manufacturing method as that for Example 1 is used to prepare a flexure (11) having a conductive polymer layer (39) of 200 nm thick and a wiring-substrate surface resistance of $1.E+6\Omega$ as shown in FIGS. 15 and 16.

[Examination of Examples 1 to 5]

As shown in FIGS. 15 and 16, the surface resistance of the conductive polymer layer gradually decreases as the thickness thereof increases. As shown in FIG. 16, the surface resistance of the conductive polymer layer is about $5.E+9\Omega$ when the thickness thereof is 18 nm (corresponding to Example 1), and when the thickness thereof is 130 nm, is about $1.E+7\Omega$. As is apparent from the data shown in FIGS. 15 and 16, the characteristics of each flexure coated with a conductive polymer layer having a surface resistance in the range of about $1E7\Omega$ to about $5.E+9\Omega$ are acceptable to suppress electrostatic charge, ion migration, and transmission loss.

It is understood from the data shown in FIGS. 15 and 16 that Examples 1 to 5 each having a conductive polymer layer of a thickness in the preferable range of 18 to 130 nm are appropriate for providing acceptable characteristics.

[Effect of Examples 1 to 5]

In each of Examples 1 to 5 of the present invention, the flexure is substantially coated with the conductive polymer layer having a uniform thickness in the range of 18 to 130 nm, to provide proper quality and reliability to solve the problems of electrostatic discharge and ion migration. Namely, the flexure of each of Examples 1 to 5 can simultaneously solve the problems of electrostatic discharge and ion migration that are trade-offs, as well as minimizing a transmission loss.

The flexure 11 is coated with the conductive polymer layer 39 except the slider mount 17 thereof. This configuration remarkably improves the ion migration endurance of the flexure 11.

The method of manufacturing a flexure according to the present invention employs the dipping technique, and therefore, the conductive polymer layer 39 formed around the flexure 11 is smooth and uniform and has an excellent appearance.

The flexure 11 manufactured according to the method of the present invention can prevent the deterioration and breakage of a magnetic head to which the flexure 11 is attached to form a head suspension. This results in improving the yield of head suspensions. Also, the flexure 11 of the present invention hardly adheres to a carrier jig due to static electricity during a suspension assembling work. This results in reducing a percent defective of head suspensions.

[Head Suspension with Flexure]

Figure 17:
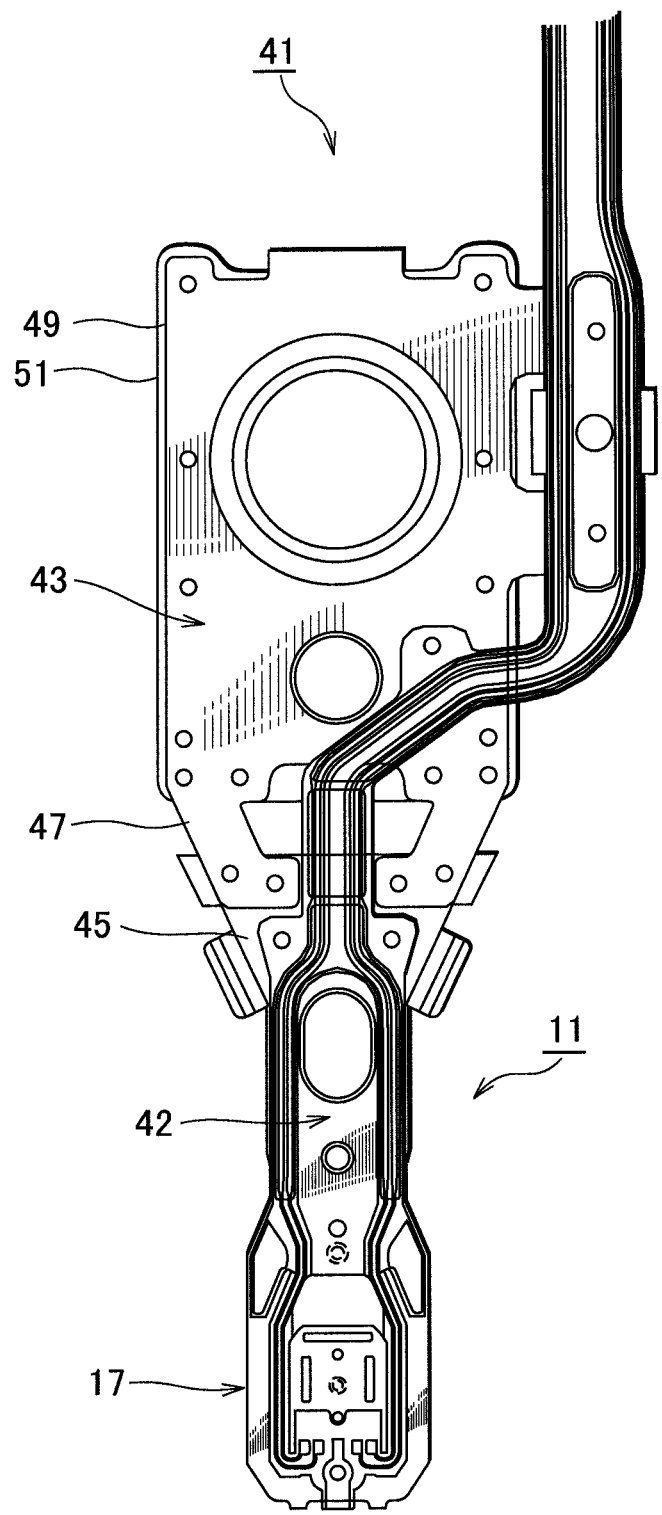
FIG. 17 is a plan view showing a head suspension provided with a flexure according to an embodiment of the present invention.

FIG. 17 shows a head suspension 41 according to an embodiment of the present invention. The head suspension 41 includes a load beam 42, a base 43, and a flexure 11 produced according to the present invention.

The load beam 42 applies load onto a slider mount 17 of the flexure 11 and consists of a rigid part 45 and a resilient part 47. The rigid part 45 is made of, for example, stainless steel and is relatively thick, for example, about 100 μm thick.

The resilient part 47 is formed separately from the rigid part 45 and is made of, for example, a thin resilient stainless steel rolled plate. The resilient part 47 has a precision low spring constant that is lower than that of the rigid part 45. The thickness of the resilient part 47 is, for example, t=40 μm. A first end of the resilient part 47 is fixed to a rear end of the rigid part 45 by, for example, laser welding. A second end of the resilient part 47 is integral with a reinforcing plate 49.

The base 43 has a base plate 51 that is overlaid on the reinforcing plate 49 and is fixed thereto by, for example, laser welding. Namely, the base plate 51 is reinforced with the reinforcing plate 49, to form the base 43. The base 43 is attached to a carriage arm (not shown) so that the head suspension 41 may turn around a spindle.

The head suspension 41 according to the embodiment has the flexure 11 that is coated with a conductive polymer layer 39 having a thickness in the range of 18 to 130 nm, and therefore, the quality and reliability of the flexure 11 are acceptable in terms of electrostatic discharge and ion migration. Namely, the head suspension 41 can solve both the problems of electrostatic discharge and ion migration that are trade-offs, and at the same time, can minimize a transmission loss.

The present invention explained above apparently allows a variety of modifications of like natures without departing from the spirit and scope of the present invention. It must be understood that such modifications or alterations that are apparent for those skilled in the art are within the scope of the present invention.

What is claimed is:

1. A method of improving electrical characteristics of a flexure having a substrate made of a thin conductive metal plate, a base insulating layer made of flexible resin formed on the substrate, wiring patterns formed on the base insulating layer and connected to slider pads of a slider mount toward a first end of the flexure, and a cover insulating layer formed to cover the wiring patterns, the method comprising:

dipping the flexure in conductive polymer solution longitudinally from a second end of the flexure to an upper limit located between the second end and the slider pads, to prevent the conductive polymer solution from crawling and reaching the slider pads and to form a conductive polymer layer spanning a region dipped in the conductive polymer solution, a region surrounding the slider pads being bare of the conductive polymer layer.

2. The method of claim 1, wherein the conductive polymer solution is applied to the region dipped therein entirely in a cross section including at least a portion of the substrate.

3. The method of claim 1, wherein the conductive polymer layer has a thickness in a range of 18 to 130 nm.

4. The method of claim 1, wherein the conductive polymer solution is a mixture of pi-electron-conjugated polymer and hydrophilic binder.

* * * * *